United States Patent [19]

Ponjee et al.

[11] Patent Number: 4,940,673
[45] Date of Patent: Jul. 10, 1990

[54] PN JUNCTION PASSIVATION USING METHYLATED SILYLOXY GROUPS

[75] Inventors: Johannes J. Ponjee; Fredericus J. Touwslager; Ivo G. J. Camps, all of Eindhoven, Netherlands

[73] Assignee: U.S. Philips Corporation, New York, N.Y.

[21] Appl. No.: 249,612

[22] Filed: Sep. 26, 1988

[30] Foreign Application Priority Data

Oct. 2, 1987 [NL] Netherlands ............ 8702352

[51] Int. Cl.$^5$ .............. H01L 21/00; H01L 21/02; H01L 21/312; H01L 21/314
[52] U.S. Cl. .................... 437/225; 437/228; 437/235; 437/238; 437/239; 437/96; 437/99; 357/8; 357/52; 357/72
[58] Field of Search ............ 437/235, 238

[56] References Cited

U.S. PATENT DOCUMENTS 4,564,562  1/1986  Wong .......................... 427/96
4,626,556  12/1986  Nozue et al. ................. 357/8
4,723,978  2/1988  Clodgo et al. ................ 156/643

FOREIGN PATENT DOCUMENTS 1273319  11/1960  France .
0130165  6/1988  Japan .

OTHER PUBLICATIONS

Plueddemann, E., "Silylating Agents", Encyclopedia of Chemical Tech., 3rd Ed., vol. 21, pp. 962–973, Wiley & Sons, 1983.

Primary Examiner—Brian E. Hearn
Assistant Examiner—B. Everhart
Attorney, Agent, or Firm—Norman N. Spain

[57] ABSTRACT

The invention relates to a method of manufacturing a semiconductor device, in which methylated silyloxy groups are formed on a silicon oxide layer which protects a PN junction, the methylated silyloxy groups being formed to reduce the leakage current of the device.

The method employs a solution in which an amine is present which is at least di-substituted.

9 Claims, 1 Drawing Sheet

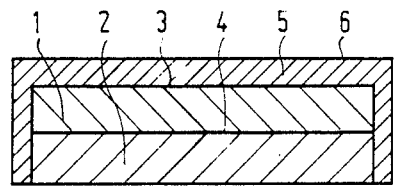

PN JUNCTION PASSIVATION USING METHYLATED SILYLOXY GROUPS

BACKGROUND OF THE INVENTION

The invention relates to a semiconductor device comprising a semiconductor body whose surface is provided, at least at the location of a PN junction, with a silicon oxide layer, methyl-substituted silyloxy groups being formed on the surface of the silicon oxide layer.

Such a method is described in French Patent 1.273.319. In this patent use is made of trimethyl methoxy silane. Using small quantities of water this compound hydrolyzes to trimethyl silanol and methanol. Subsequently, trimethyl silanol reacts with hydroxyl groups on the surface of the silicon oxide layer to form trimethyl silyloxy groups.

However, the methanol present may also convert the hydroxyl groups on the surface of the silicon oxide layer into methoxy groups. As a consequence hereof the surface of the silicon oxide layer is not optimally occupied by methylated silyloxy groups, thus enabling moisture from the environment to migrate to the semiconductor body via the silicon oxide layer and thereby increasing the leakage current over the PN junction.

SUMMARY OF THE INVENTION

One of the objects of the invention is to minimize the leakage current, and the invention is based, amongst others, on the insight that this can be realized by means of an optimum occupation of the surface of the silicon oxide layer by methylated silyloxy groups.

According to the method of the invention, optimum occupation of the surface of the silicon oxide layer is achieved by exposing the silicon oxide layer to a solution capable of reacting with hydroxyl groups present on the surface of the silicon oxide layer to form methyl-substituted silyloxy groups, which solution contains an amine that is at least di-substituted or an amino group that is at least di-substituted.

By means of the method in accordance with the invention an optimum occupation of the surface of the silicon oxide layer by methylated silyloxy groups and a semiconductor device having a low leakage current is obtained.

BRIEF DESCRIPTION OF THE DRAWING

The sole FIGURE in the drawing is a diagrammatic sectional view of a part of a semiconductive device during its manufacture according to the method of the invention.

DETAILED DESCRIPTION OF THE INVENTION

Preferably, the dialkylamine is used as the amine, in which the alkyl is, methyl, ethyl, or propyl. In this way a very favorable result is obtained, particularly if the method in accordance with the invention is carried out at an increased temperature (for example at approximately 100° C.).

The silyloxy groups are formed by immersing the semiconductor body in the solution, or in the vapour of the refluxing solution. In the latter case, dry semiconductor bodies are obtained in a readily conceivable manner, which can readily be subjected to further processing.

Toluene is a very suitable solvent for the solution.

If, preferably, a solution is used which contains a compound selected from the group consisting of (dialkyl amine)-trimethyl silane and bis (dialkyl amine)-dimethyl silane, in which alkyl is methyl, ethyl or propyl, amine can be present in the solution as a functional group of the silane.

In the case of the first compound a hydroxyl group of the surface of the silicon oxide layer reacts, thereby forming, for example, diethyl amine and a trimethyl silyloxy group at the said surface.

In the case of the second compound two hydroxyl groups react, thereby forming, for example, two molecules diethyl amine and one dimethyl silyldioxy group at the surface of the silicon oxide layer. In both cases a small leakage current of the semiconductor device is obtained.

It is also possible to use a solution containing amine as well as a compound selected from the group consisting of a trimethyl silyl compound having a silicon-bonded group which can be split off and a dimethyl silyl compound having two silicon-bonded groups which can be split off.

In this case reactions similar to the two described above take place at the surface of the silicon oxide layer. Preferably, the groups which can be split off are selected from the group consisting of chlorine, methoxy and ethoxy.

The invention will now be explained in greater detail by means of an example and with reference to the accompanying drawing.

In the method in accordance with the invention a semiconductor device is manufactured comprising semiconductor bodies 1, 2 whose surface 3 is provided with a silicon oxide layer 5, at least at the location of a PN junction 4, methyl-substituted silyloxy groups being formed on a surface 6 of the silicon oxide layer 5.

To improve the occupation of the surface 6 by methyl-substituted silyloxy groups and to reduce the leakage current of the semiconductor device a solution in which an amine is present which is at least di-substituted is used to form the methyl-substituted silyloxy groups.

This amine is, for example, diethylamine. The methylated silyloxy groups are formed in the solution in which the amine is present or in the vapour of this solution.

The amine may be a functional group of the silane, if, for example, (diethyl-amino)-trimethyl silane or bis (diethyl amino)-dimethyl silane are used. In the former case a hydroxyl group reacts at the surface 6, thereby forming a trimethyl silyloxy group at the surface 6 and diethylamine. In the second case two hydroxyl groups react and a dimethyl silyldioxy group is formed at the surface 6. In both cases a very good occupation of the surface 6 of the silicon oxide layer 5 by methylated silyloxy groups is obtained. The amine may also be added to the solution separate from the silane. In this case, a silane is used which is substituted with methyl and groups which can be split off. These groups are, for example, chlorine, methoxy and ethoxy.

Very good results are obtained if one or more semiconductor bodies 1, 2 which are provided with a silicon oxide layer 5 are arranged in the vapour zone of a boiling apparatus in which a solution is refluxed which contains a 2% solution of (diethyl amino)-trimethyl silane in toluene, which is heated for 1 hour at 111° C. (boiling point of toluene).

It has been found that the semiconductor devices which are treated in accordance with the invention have a leakage current between $10^{-11}$ and $10^{-12}$ A, which is a factor of $10^3$ smaller than the leakage current of untreated semiconductor devices.

The method in accordance with the invention is not limited to the example described herein. For example, pyridine can be used as an amine. With respect to the invention described herein, it will be clear to those skilled in the art that other variations and modifications than those described herein are possible without departing from the scope of the invention.

What is claimed is:

1. A method of minimizing leakage current on a PN junction present in a semiconductor device the surface of which is provided, at least at the location of the PN junction, with a silicon oxide layer, comprising forming methyl-substituted silyloxy groups on the surface of said layer by exposing said silicon oxide layer with a solution capable of forming such groups and in which solution an amine is present in which two alkyl groups are directly attached to the amino nitrogen.

2. A method of minimizing leakage current on a PN junction present in a semiconductor device the surface of which is provided, at least at the location of the PN junction, with a silicon oxide layer, comprising forming methyl-substituted silyloxy groups on the surface of said layer by exposing, at a temperature of approximately 100° C., said silicon oxide layer to a solution capable of forming such groups and in which solution an amine is present in which two alkyl groups are directly attached to the amino nitrogen.

3. A method as claimed in claim 1 wherein amine is a dialkylamine in which the alkyl is methyl, ethyl or propyl.

4. A method as claimed in claim 1, characterized in that the silyloxy groups are formed in vapour of the solution while refluxing.

5. A method as claimed in claim 1, characterized in that the silyloxy groups are formed by immersing the semiconductor body in the solution.

6. A method as claimed in claim 1, characterized in that a solution is used which contains a compound selected from the group consisting of (dialkyl amino)-trimethyl silane and bis (dialkyl amino)-dimethyl silane, in which alkyl is methyl, ethyl or propyl.

7. A method as claimed in claim 1, characterized in that a solution is used which contains an amine and a compound selected from the group consisting of a trimethyl silyl compound having a silicon-bonded group which can be split off and a dimethyl silyl compound having two silicon-bonded groups which can be split off.

8. A method as claimed in claim 7, characterized in that the groups which can be split off are selected from the group consisting of chlorine, methoxy and ethoxy.

9. A method as claimed in claim 1, characterized in that toluene is selected as a solvent.

* * * * *